United States Patent
Xu et al.

(10) Patent No.: US 7,500,366 B2
(45) Date of Patent: Mar. 10, 2009

(54) REFRIGERATOR WITH MAGNETIC SHIELD

(75) Inventors: Mingyao Xu, Emmaus, PA (US); Jin Lin Gao, Shanghai (CN); Ralph C. Longsworth, Allentown, PA (US)

(73) Assignees: SHI-APD Cryogencis, Inc., Allentown, PA (US); Sumitomo Heavy Industries, Ltd., Tokyo (JP)

( * ) Notice: Subject to any disclaimer, the term of this patent is extended or adjusted under 35 U.S.C. 154(b) by 344 days.

(21) Appl. No.: 11/297,125

(22) Filed: Dec. 8, 2005

(65) Prior Publication Data

US 2007/0130961 A1    Jun. 14, 2007

(51) Int. Cl.
F25B 9/00    (2006.01)
H01F 7/00    (2006.01)

(52) U.S. Cl. ............................ 62/6; 335/301

(58) Field of Classification Search ............... 62/6; 335/301
See application file for complete search history.

(56) References Cited

U.S. PATENT DOCUMENTS

| | | | |
|---|---|---|---|
| 3,331,041 A | 7/1967 | Bogner | |
| 4,803,452 A | 2/1989 | Saji et al. | |
| 5,447,033 A * | 9/1995 | Nagao et al. | 62/6 |
| 5,481,879 A | 1/1996 | Asami et al. | |
| 5,638,685 A * | 6/1997 | Inaguchi et al. | 62/6 |
| 5,701,744 A * | 12/1997 | Eckels et al. | 62/47.1 |
| 6,029,458 A * | 2/2000 | Eckels | 62/47.1 |
| 6,256,998 B1 | 7/2001 | Gao | |
| 6,990,818 B2 * | 1/2006 | Hofmann | 62/6 |
| 7,318,318 B2 * | 1/2008 | Roth | 62/6 |
| 2004/0169515 A1 * | 9/2004 | Koga et al. | 324/318 |
| 2005/0253676 A1 * | 11/2005 | Bovier et al. | 335/284 |

FOREIGN PATENT DOCUMENTS

JP    2161260    6/1990

* cited by examiner

*Primary Examiner*—William C Doerrler
(74) *Attorney, Agent, or Firm*—Katten Muchin Rosenman LLP (57) ABSTRACT

A magnetic shield is mounted in its own vacuum enclosure in a regenerative type expander comprising a vacuum enclosure, magnetic material in a cold regenerator, and a magnetic shield, where the magnetic shield surrounds the magnetic material.

19 Claims, 6 Drawing Sheets

FIG. 7

REFRIGERATOR WITH MAGNETIC SHIELD

BACKGROUND OF THE INVENTION

Gifford McMahon (GM), GM type pulse tube, Stirling and Stirling type pulse tube refrigerators operating in a MRI cryostat are used to cool a superconducting magnet either by conduction through a direct connection between the cold end of the expander and the magnet, or by operating in a helium filled neck tube of the MRI cryostat where the refrigerator recondenses helium that is cooling the MRI magnet. Both a conventional type GM expander, as described in U.S. Pat. No. 5,447,033 by Nagao, and a pulse tube type as described in U.S. Pat. No. 6,256,998 by Gao, use rare earth materials in the cold end of the regenerator in order to provide cooling at 4 K.

The rare earth materials have magnetic properties that cause them to interact with the magnetic field in the bore of the MRI magnet and result in noise being superimposed on the imaging signal. This problem is described in JP 2600869 by Nagao, filed on 13 Dec. 1988, for a conventional GM refrigerator in which the rare earth material is contained in the reciprocating second stage displacer. This patent describes several different designs of magnetic shields that prevent the rare earth material from introducing noise into the MRI signal. The expanders are described as operating in the vacuum in the MRI cryostat; thus the magnetic shield can be attached to an expander heat station and cooled to a uniform temperature without heat transfer between the shield and the expander cylinder.

Means for constructing superconducting shields are described in Bogner, U.S. Pat. No. 3,331,041, filed on 21 Apr. 1968, and Saji, U.S. Pat. No. 4,803,452, filed 29 Dec. 1987. More recently, high temperature superconductors (HTS) have been developed that operate at temperatures in the range of 80 K. While the earlier shields were designed for operating temperatures near 4 K, it is now possible to construct shields from HTS materials and cool them at the first stage of a two stage GM type refrigerator.

Eckels, U.S. Pat. No. 5,701,744, issued 30 Dec. 1997, describes a conventional two stage 4 K GM expander mounted in the neck tube of a MRI cryostat where it is surrounded by helium gas. The expander plugs into the neck tube and can easily be removed to be serviced without warming the magnet. It comes into thermal contact with a first stage heat station in the neck tube that is connected to a thermal shield at about 40 K, and into thermal contact at the second stage 4 K heat station which is connected to a helium recondenser and a magnetic shield.

The magnetic shield is located on the vacuum side of the neck tube so that it is thermally isolated from the neck tube and the expander cylinder. Thermal conducting strips are layered with the superconducting shield material to keep the assembly near 4 K.

Two-stage GM type pulse tubes operating at 4 K introduce much less noise to a MRI signal than conventional two-stage GM expanders because the cold regenerator containing rare earth materials is stationary. However noise continues to be introduced either due to small motion from pressure cycling the pulse tube, or due to thermal cycling of the regenerator material.

Most conventional GM expanders have the regenerators packed inside the displacer bodies, thus they reciprocate with the displacer. This arrangement provides a compact design with a single stepped cylinder. When mounted in the neck tube of a MRI cryostat, the helium gas in the neck tube transfers heat by convection between the neck tube and the expander cylinder. Thermal losses are minimized by mounting the neck tube in a near vertical orientation. The expander cylinder and the neck tube have almost the same temperature gradients.

Pulse tube expanders typically have the regenerators in tubes that are spaced closely apart from the pulse tubes and parallel to them. When mounted in a MRI neck tube surrounded by helium gas the temperature differences between the regenerators and pulse tubes result in convective thermal losses between them, in addition to thermal losses due to heat exchange with the neck tube.

U.S. Ser. No. 60/650,286 entitled "Multi-stage Pulse Tube with Matched Temperature Profiles" filed Feb. 4, 2005, incorporated herein by reference and made a part hereof, describes means to minimize thermal losses due to convection in a helium filled neck tube. The addition of a magnetic shield, as described in JP 2600869, within the neck tube is impractical because a shield that uses low temperature superconducting material has to be kept near 4 K, thus convective losses would be excessive. If the magnetic shield is placed in the vacuum outside the neck tube, as described in U.S. Pat. No. 5,701,744, it becomes large and expensive.

Stirling type pulse tubes have recently been built with magnetic materials in the regenerators and have reached 4K. This has been difficult to achieve because of their relatively high operating speeds.

In the prior art, the magnet shield is attached at the outside of the cylinder, which requires a large size shield. Typically, the shield is made of superconducting materials, which are expensive especially in a pulse tube refrigerator, where the 2nd stage heat station is much larger than that of a GM refrigerator.

Therefore, it is an objective of the present invention to provide a magnetic shield which effectively shields the MRI equipment from magnetic materials in the expander.

It is an object of this invention to provide a magnetic shield which is in a vacuum enclosure that is part of the expander assembly, and is independent of the vacuum in the cryostat.

It is a further object of this invention to provide a magnetic shield which effectively shields the MRI equipment from magnetic materials in the expander while minimizing heat losses.

It is a further object of this invention to provide a magnetic shield which can be used with Stirling refrigerators and Stirling type pulse tubes.

It is another object of this invention to provide a regenerative type expander where magnetic material is surrounded by a magnetic shield that may be fixed or removable for easy servicing.

These and objects will be apparent from the following description.

SUMMARY OF THE INVENTION

The essential feature of this invention is a magnetic shield mounted in its own vacuum enclosure. When so mounted, it may surround cold magnetic regenerator material in a pulse tube, GM, or other regenerative type expander, and the enclosure can be in contact with helium gas that is in the expander or in the space around the expander.

The pulse tube or GM expander with a magnetic shield may be used to cool a superconducting MRI magnet to about 4 K in any of various applications. The principal application of a pulse tube or GM expander with a magnetic shield is to cool a superconducting MRI magnet to about 4 K. An expander with this invention can be mounted either in the MRI cryostat vacuum space or in a helium filled neck tube in the cryostat.

Convective thermal losses of a multi-stage 4 K pulse tube expander in a helium filled neck tube of a MRI cryostat are minimized by the vacuum enclosure that contains the magnetic shield. The vacuum enclosure with the shield is part of the expander assembly and is removed with the expander when it is serviced. Depending on the type of superconducting material used in the shield, it can be cooled either by the first or second stage of the expander.

The shield is annular in shape and surrounds the magnetic regenerator material in a regenerative type expander. An expander with this invention can be mounted either in the neck tube of a MRI cryostat or in the cryostat vacuum space. When mounted in the neck tube it may be surrounded by a gas such as helium. In the case of a pulse tube expander thermal losses between the regenerator, magnetic shield, pulse tube, and neck tube are minimized by the vacuum enclosure that contains the shield.

BRIEF DESCRIPTION OF THE DRAWINGS

In the following drawings like numbers represent like parts.

DETAILED DESCRIPTION OF THE INVENTION

This invention provides a means of placing a magnetic shield around the magnetic material in the cold end of a 4 K pulse tube or GM expander or other type expander. The magnetic shield of this invention can be used with the expanders of Stirling refrigerators and Stirling type pulse tube refrigerators if there are advances in refrigerator technology. In general this invention can be used with any type of regenerative cooler.

This is accomplished by having the magnetic shield located within a vacuum enclosure that is part of the expander. In a preferred embodiment an annular vacuum enclosure is located inside the cold regenerator sleeve in the case of a pulse tube, or inside the cold cylinder in case of a GM expander. For a pulse tube, the magnetic regenerator material is packed in the bore of the vacuum enclosure, while for a GM expander the cold displacer, which has magnetic regenerator material in it, reciprocates in the bore of the vacuum enclosure.

Pulse tube expanders are typically mounted in a near vertical orientation so the top of a pulse tube is synonymous with the warm end, and the bottom of the pulse tube is synonymous with the cold end. Two-stage expanders are used to illustrate the principles of the invention but the invention also applies to any stage of an expander that contains magnetic materials. Such materials are typically only used in cold regenerators that are operating between 3 K and 40 K. The following examples all show the magnetic shield cooled by the second stage of the expander but if the magnetic shield is made of HTS material it may be cooled by the first stage of the expander.

Figures 1, 2:
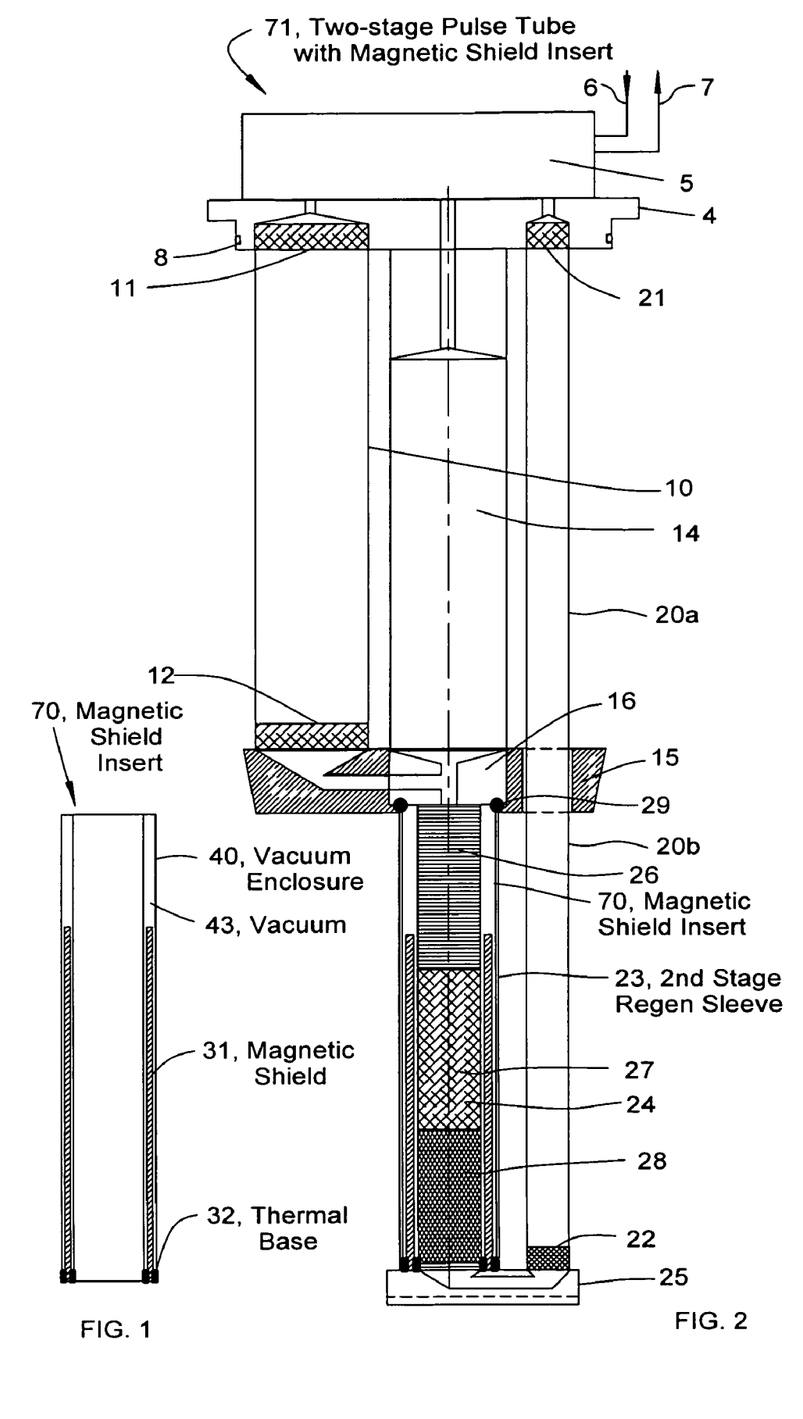
FIG. 1 is a cross section of an annular magnetic shield in an annular vacuum enclosure.
FIG. 2 is a schematic of a two-stage pulse tube expander with the magnetic shield of FIG. 1. shown as an insert in the cold regenerator sleeve.

FIG. 1 is a cross section of magnetic shield insert 70 which comprises annular magnetic shield 31 in annular vacuum enclosure 40. Magnetic shield 31 is thermally isolated from vacuum enclosure 40 except at one end where thermal base 32 conducts heat out the end of magnetic shield 31. Magnetic shield 31 is typically designed with enough thermally conductive material to keep it near the temperature of thermal base 32, approximately 4 K, while vacuum enclosure 40 may have a temperature gradient and a temperature of about 40 K at the top end.

FIG. 2 is a schematic of two-stage pulse tube expander 71 with magnetic shield insert 70 inside cold regenerator sleeve 23. Second stage regenerator 24 comprises nonmagnetic material 26 at the warm end, type I magnetic material 27 in the middle, and type II magnetic material 28 at the cold end, all packed in the bore of magnetic shield insert 70.

Two-stage pulse tube expander assembly 71 includes first stage pulse tube 10, first stage regenerator 14, second stage pulse tube 20, (shown as having a warm end 20a and a cold end 20b), second stage regenerator 24 warm flange 4, warm flow smoothers 11 and 21, cold flow smoothers 12 and 22, first stage heat station 15, second stage heat station 25, and valve/orifice/buffer assembly 5. A detailed description of these components and the operation of the pulse tube can be found in U.S. Pat. No. 6,256,998, incorporated herein by reference and made a part hereof. Tube 6 carries high pressure helium from the compressor (not shown) to the valve in 5, and tube 7 returns helium at low pressure to the compressor.

First stage regenerator 14 is typically packed in a removable sleeve. Heat station 15 has a removable flow distributor 16 that permits shield insert 70 with regenerator 24 in it to be installed from the warm end of the pulse tube. Gas is prevented from flowing between the outside of insert 70 and regenerator sleeve 23 by seal 29. The design is such that the cold end of insert 70 is brought into thermal contact with heat station 25. It is typical to construct pulse tubes 10 and 20, and the shells for regenerators 14 and 24, from thin walled SS tubes to minimize axial conduction losses.

Figure 3:
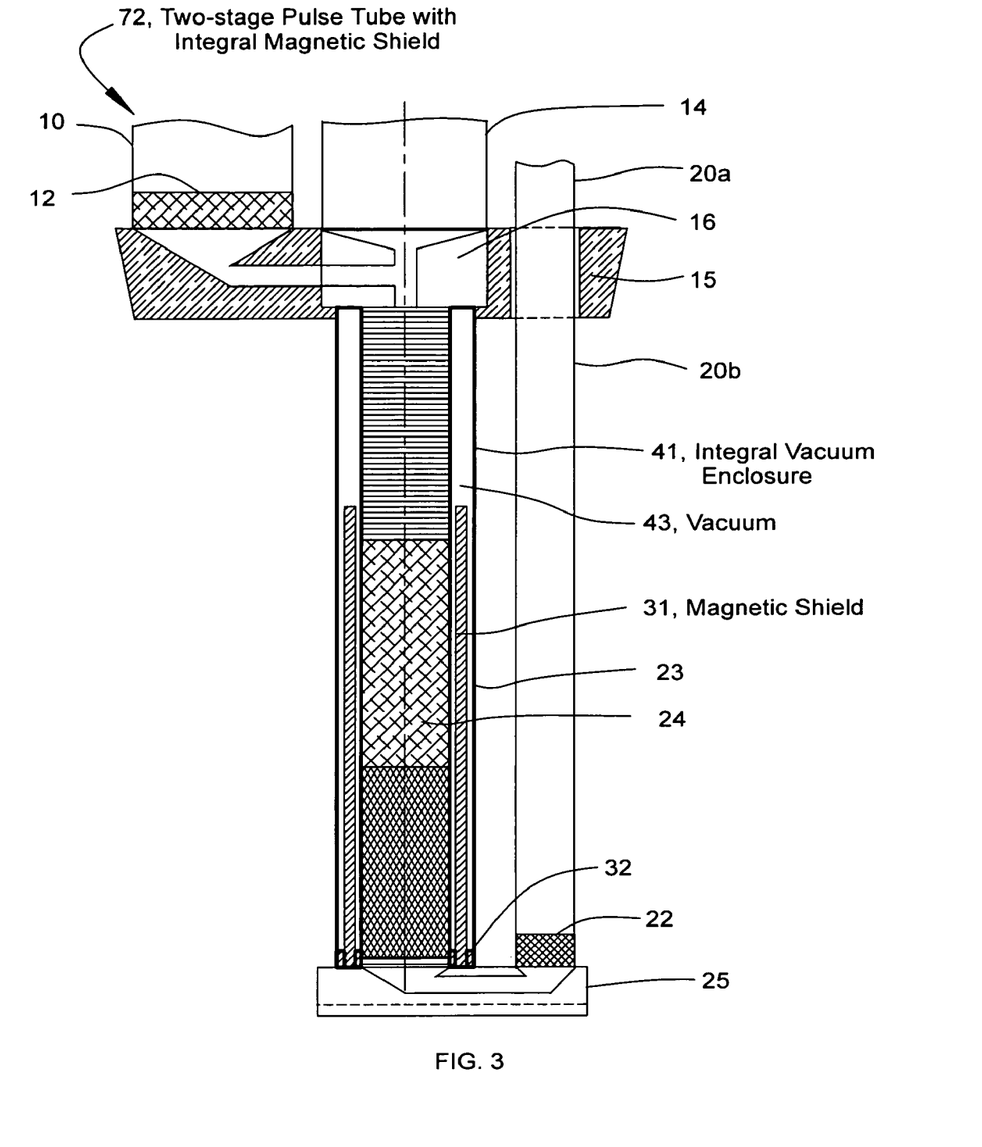
FIG. 3 is a schematic of a second embodiment of the present invention. It shows a two-stage pulse tube expander with the magnetic shield in an annular vacuum enclosure in which the cold regenerator sleeve is the outer wall of the vacuum enclosure.

FIG. 3 shows two-stage pulse tube expander 72 with magnetic shield 31 in annular vacuum enclosure 41 in which cold regenerator sleeve 23 is the outer wall of the vacuum enclosure. Magnetic shield 31 and vacuum enclosure 41 are thus an integral part of the pulse tube. The inner bore of enclosure 41 contains regenerator 24. Magnetic shields are relatively expensive. Expanders 71 and 72 both have small magnetic shields and are thus less expensive to manufacture relative to prior designs.

Figure 4:
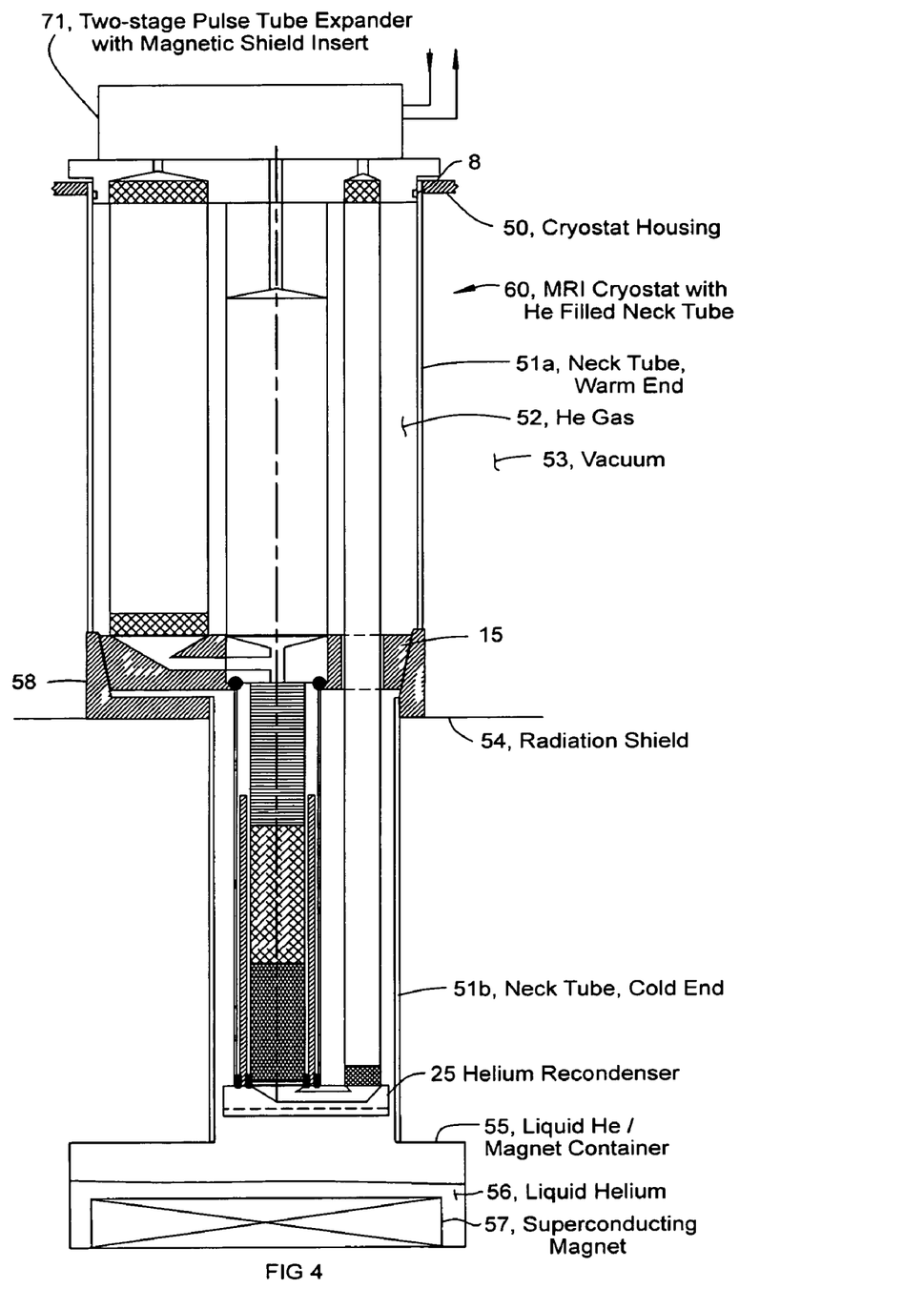
FIG. 4 is a schematic of the present invention which shows the two-stage pulse tube of FIG. 2 mounted in the neck tube of a MRI cryostat where it is surrounded by helium gas.

FIG. 4 is a schematic of the most common application of the present invention. MRI cryostat with helium filled neck tube 60 is shown with two-stage pulse tube 71 inserted in it. MRI cryostat assembly 60 consists of an outer housing 50 that is connected to inner vessel 55 by a neck tube, consisting of warm end neck tube 51a, heat station 58, and cold end neck tube 51b. Vessel 55 contains liquid helium 56 and superconducting MRI magnet 57. It is surrounded by vacuum 53. A typical MRI cryostat has a radiation shield 54 that is cooled to about 40 K through 58 by first stage heat station 15 of pulse tube expander 71. Pulse tube 72 with an integral vacuum enclosure for the magnetic shield is functionally equivalent to expander 71. Heat station 15 is shown as being conically shaped to mate with neck tube heat station 58. Radial "O" ring 8 enables pulse tube 71 to be inserted into the neck tube until pulse tube heat station 15 is thermally engaged with neck tube heat station 58.

This arrangement allows pulse tube expander 71 or 72 to be easily removed from MRI cryostat assembly 60 for service. Helium gas 52 occupies the space between expander 71 and the neck tube in assembly 60. In operation there is a temperature gradient from room temperature, about 290 K, at the top, to 4 K at the bottom. The pulse tube expander has first stage heat station 15 at about 40 K that is used to cool a shield in the magnet cryostat, and helium recondenser 25 at the second stage that keeps the superconducting MRI magnet near 4 K.

Vacuum enclosures 40 or 41 around magnetic shield 30, which have magnetic regenerator materials packed in the bore, provide thermal isolation between regenerator sleeve 23, pulse tube 20b, and neck tube sleeve 51b, in the presence of helium 52 in the neck tube.

Second stage pulse tube 20 is shown as not being in physical contact with heat station 15. Typically when a two stage pulse operates in a vacuum there is an advantage in not having thermal contact. In the present case, when helium surrounds the pulse tubes, it is less advantageous, but it is a choice of the designer. U.S. Ser. No. 60/650,286 entitled "Multi-stage Pulse Tube with Matched Temperature Profiles" filed Feb. 4, 2005, incorporated herein by reference and made a part hereof, provides an extensive discussion of options for addressing these design issues.

Figure 5:
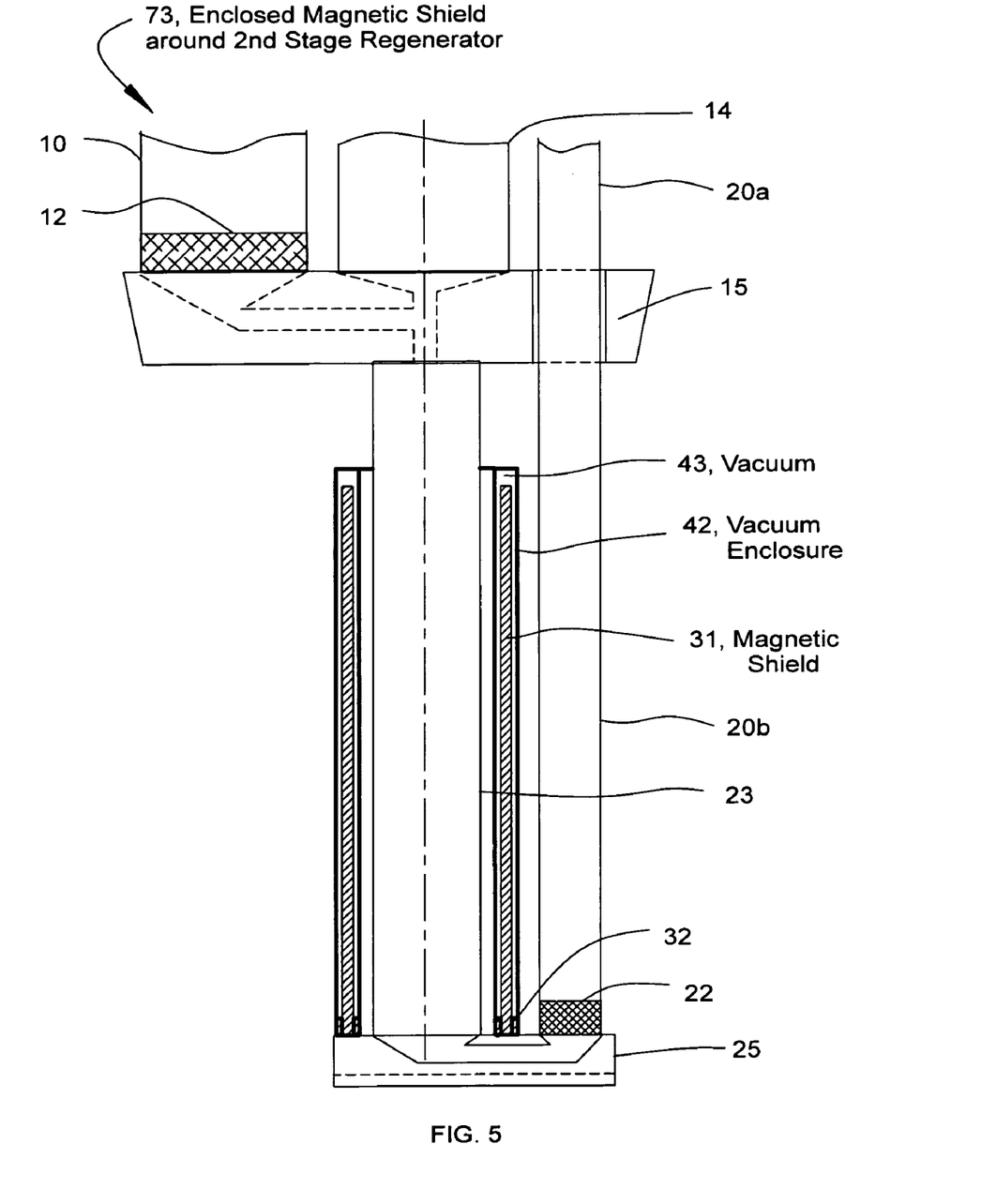
FIG. 5 is a schematic of a third embodiment of the present invention showing a two-stage pulse tube with an annular magnetic shield that is contained in an annular vacuum enclosure that is external to the second stage regenerator sleeve.

FIG. 5 shows two-stage pulse tube assembly 73 which has annular vacuum enclosure 42 with vacuum space 43 surrounding magnetic shield 31. Second stage regenerator 24 with rare earth material is within the annular space of enclosure 42. Vacuum enclosure 42 and shield 31 are attached to second stage heat station 25 but do no not extend to first stage heat station 15. When mounted in the neck tube of MRI cryostat 60 helium gas fills the annular space between regenerator sleeve 23 and vacuum enclosure 42. This will tend to cause the temperature profiles in both to be similar. The thermal loss associated with this is small. Cost savings in manufacturing evacuated enclosure 42 with shield 31 as a subassembly may offset the small thermal loss.

Figure 6:
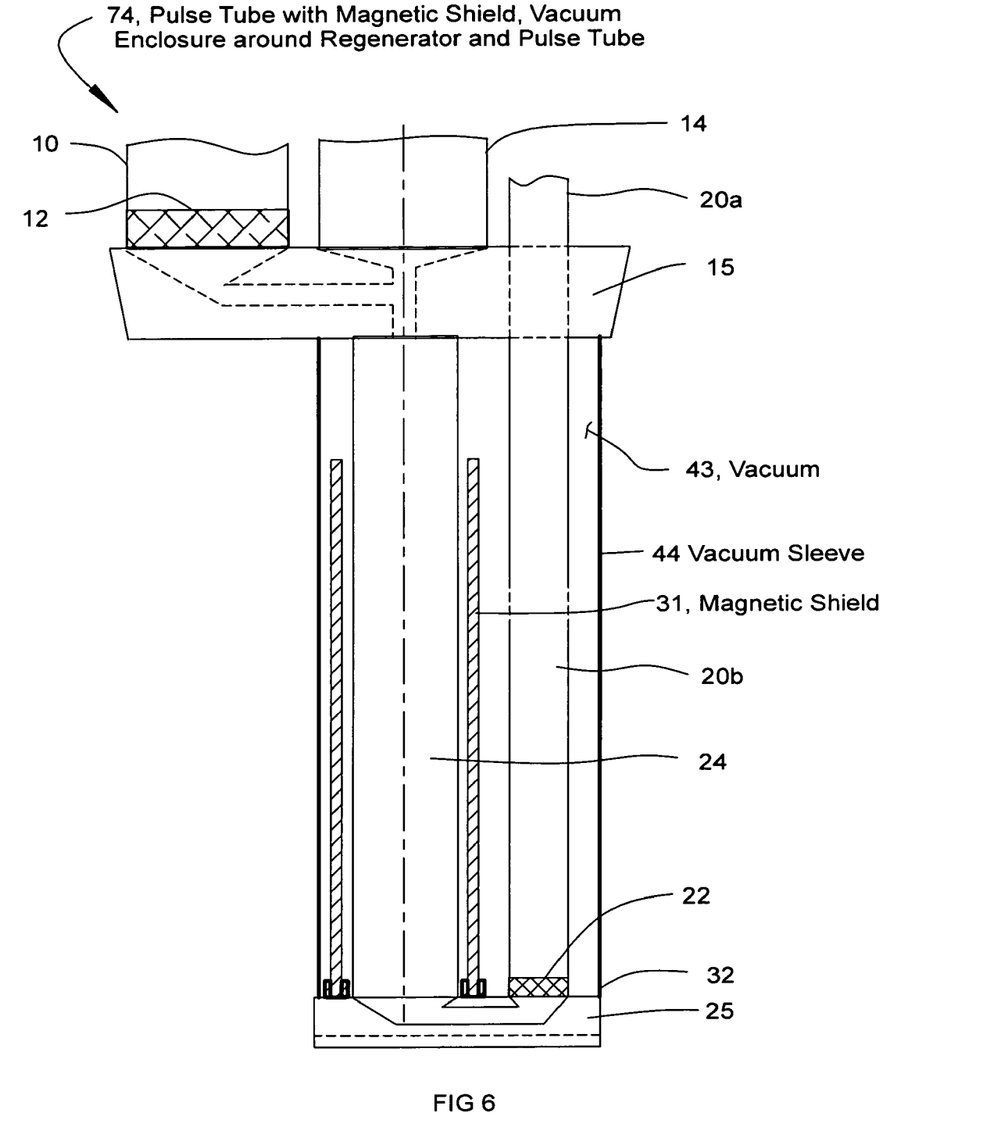
FIG. 6 is a schematic of a fourth embodiment of the present invention which shows a two-stage pulse tube with an annular magnetic shield around the cold regenerator, both of which are contained in a vacuum enclosure that also contains the cold section of the second stage pulse tube.

FIG. 6 is a schematic of two-stage pulse tube 74 with an annular magnetic shield around the cold regenerator, both of which are in a vacuum enclosure that also contains the cold section of second stage pulse tube 20b. Magnetic shield 31 is physically and thermally attached to second stage heat station 25. Vacuum enclosure 44 extends from second stage heat station 25 to first stage heat station 15. Second stage pulse tube 20 is brazed to heat station 15 in order to maintain vacuum 43 within sleeve 44. When mounted in a helium filled neck tube, conduction through the gas that fills the annular space between sleeve 44 and the neck tube in cryostat 60 will result in the temperature profiles in both tubes to be similar. Thermal losses due to convection will be small. Within enclosure 44 convection losses are eliminated.

Figure 7:
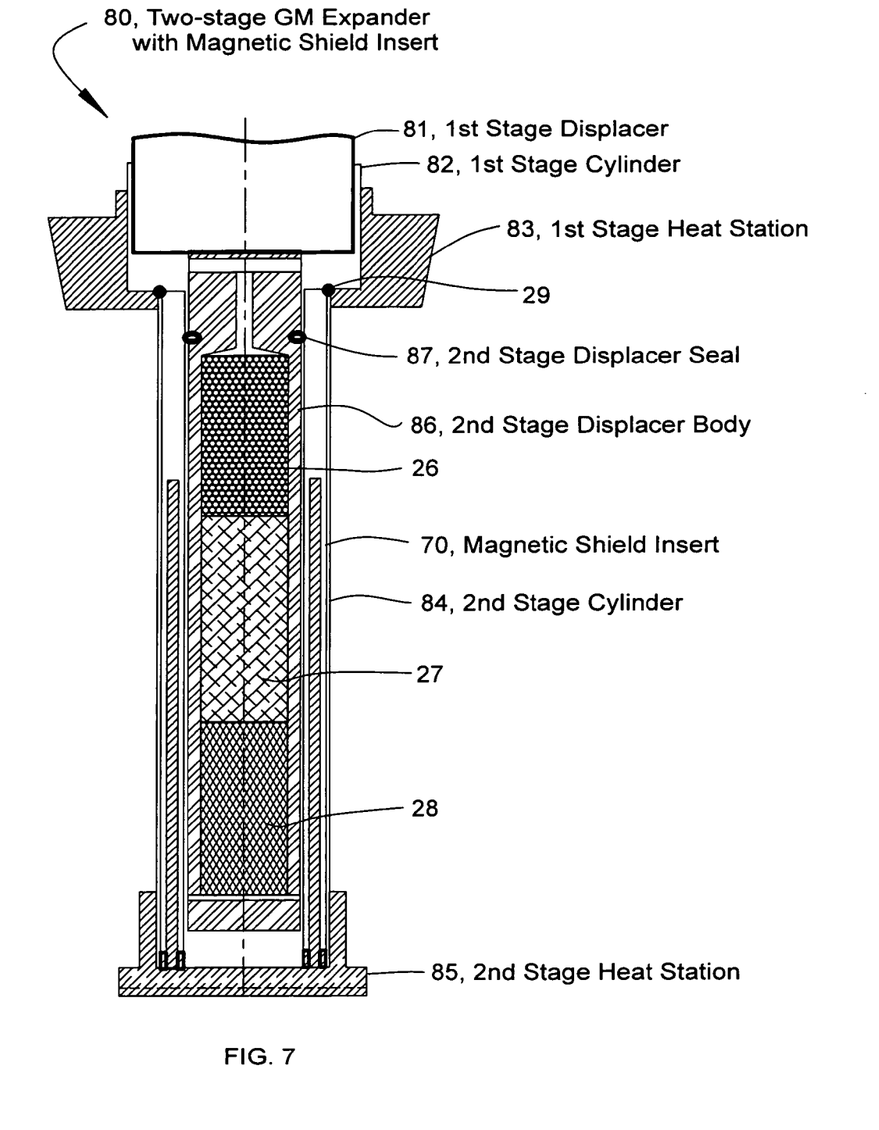
FIG. 7 is a schematic of a fifth embodiment of the present invention. It shows a two-stage GM expander with the magnetic shield of FIG. 1 as an insert in the second stage cylinder.

FIG. 7 is a schematic of the lower section of two-stage GM expander 80 with the magnetic shield 70 of FIG. 1 as an insert in second stage cylinder 84. First stage displacer 81 is coupled to second stage displacer body 86. Displacer 81 reciprocates in cylinder 81 and produces refrigeration in the space at the cold end which receives heat from first stage heat station 83. Regenerator materials 26, 27, and 28 are packed in displacer body 86 which reciprocates in the bore of vacuum enclosure 70. Refrigeration is produced in the space at the cold end and heat is received from heat station 85. Static seal 29 prevents gas from by-passing between the outer wall of insert 70 and the inner wall of cylinder 84. Seal 87 on displacer body 86 prevents gas from by-passing the cold regenerator. It is noted that a grooved displacer body, as described in U.S. Pat. No. 5,481,879, incorporated herein by reference and made a part hereof, avoids the need for seal 87.

While FIG. 7 describes the use of removable insert 70, an integral vacuum enclosure with a magnetic shield, similar to 41 as shown in FIG. 3 for pulse tube 72, is a possible option.

It would be typical for the magnetic shield to be assembled into a sleeve that is then evacuated, but it is possible to leave residual gas, such as nitrogen, that is reduced to a very low pressure when the shield is cooled, either by virtue of the very low temperature or using an adsorbent such as charcoal.

It is understood that while the discussion has focused on the use of this invention in MRI cryostats that have superconducting magnets operating in a bath of liquid helium at 4 K it is also possible to have superconducting magnets with materials that operate at higher temperatures, thus it is possible to use liquid hydrogen at 20 K, or liquid neon at 30 K instead of liquid helium. Gaseous helium can also be used above 4 K and rely on convection to cool the magnet. Magnets and other devices can also be cooled by conduction with the expander mounted in the cryostat vacuum space. It is possible for example to have a single stage expander, with magnetic regenerator material and a shield per the present invention, operating at about 20 K to cool a superconducting magnet that is operating at about 30 K. A thermal conducting strap can transfer heat from the magnet to the expander.

Two stage expanders have been described but one stage or more stages can be employed. The stage that is coldest is referred to as the cold stage. The present invention can be applied to any source of magnetic noise in a regenerative type expander. Regenerative type expanders include GM, GM type pulse tubes, Stirling, and Stirling type pulse tubes. Depending on the material used in the magnetic shield, it can be cooled by either the first or second stage of the expander.

In a particularly preferred method of practicing the present invention, the superconductor shield is enclosed by a double-wall cartridge and the cartridge is inserted into the cylinder. The cartridge can be tight fit into the cylinder or removable.

In on embodiment, in a 4K pulse tube refrigerator, a double wall cartridge is used for the 2nd regenerator.

In a GM refrigerator, a double-wall displacer can be made as the 2nd displacer. The double wall cartridge can be manually evacuated, and getter, such as charcoal, can be attached on the walls to keep the vacuum. Even though it is not evacuated, after cool down since the temperature is close to 4K at the cold end, most of the components in the air will have solidified, acting similarly to a heat switch.

In one prior art embodiment in a 4K pulse tube, a Φ90 mm shield is needed if the shield is attached to the 2nd stage heat station. With the shield in accordance with this invention, only a Φ35 mm shield is needed.

What is claimed is:

1. A regenerative type expander comprising:
   a vacuum enclosure inside a gas filled outer sleeve forming a bore directly around the regenerative type expander material,
   magnetic material forming the expander material in the bore
   a superconducting magnetic shield, where the superconducting magnetic shield is fixed within the vacuum enclosure isolated to reduce thermal conduction from the vacuum enclosure and where the superconducting magnetic shield surrounds the magnetic material, and a thermal base at one end of the outer sleeve for conducting heat from the magnetic shield.

2. The regenerative type expander of claim 1 where the magnetic shield is a removable insert in the cold regenerator sleeve of the regenerative expander.

3. The regenerative type expander of claim 1 which is one of a GM, GM type pulse tube, Stirling, and Stirling type pulse tube.

4. The regenerative type expander of claim 3 which is one of a GM or a GM type pulse tube.

5. The regenerative type expander of claim 1 where the magnetic shield is cooled by a heat station that is colder than 80 K.

6. The regenerative type expander of claim 1 in which the magnetic shield surrounds the cold regenerator, and the vacuum enclosure surrounds the cold stage of the regenerative expander.

7. The regenerative type expander of claim 1 mounted in one of the vacuum space inside a cryostat, and a neck tube in a cryostat that contains one of helium, hydrogen, and neon.

8. The regenerative type expander of claim 1 mounted in the neck tube of a MRI cryostat and surrounded by one of helium, hydrogen, and neon.

9. The regenerative type expander of claim 8 where the vacuum enclosure has an annular bore.

10. The regenerative type expander of claim 9 where the magnetic material is located inside the annular bore.

11. The regenerative type expander of claim 9 where the magnetic shield is a removable insert in the cold regenerator sleeve of the regenerative expander.

12. The regenerative type expander of claim 9 where the magnetic shield is external to the sleeve that contains the cold regenerator.

13. The regenerative type expander of claim 8 which is one of a GM, GM type pulse tube, Stirling, and Stirling type pulse tube.

14. The regenerative type expander of claim 8 which is one of a GM or a GM type pulse tube.

15. The regenerative type expander of claim 8 where the magnetic shield is cooled by a heat station that is colder than 80 K.

16. The regenerative type expander of claim 8 in which the magnetic shield surrounds the cold regenerator, and the vacuum enclosure surrounds the cold stage of the regenerative expander.

17. The regenerative type expander of claim 1 where the magnetic shield attaches to the regenerative type expander at a cold end.

18. The regenerative type expander of claim 1 where the magnetic shield is integral to the regenerative type expander.

19. The regenerative type expander of claim 1 where the vacuum enclosure is removable with said expander.

* * * * *